(12) United States Patent
Pannetier-Lecoeur et al.

(10) Patent No.: US 8,405,390 B2
(45) Date of Patent: Mar. 26, 2013

(54) DEVICE BASED ON A MAGNETO-RESISTIVE MIXED SENSOR WITHOUT LOW FREQUENCY NOISE AND ASSOCIATED METHOD

(76) Inventors: Myriam Pannetier-Lecoeur, Bures sur Yvette (FR); Hedwige Polovy, Paris (FR); Claude Fermon, Orsay (FR)

( * ) Notice: Subject to any disclaimer, the term of this patent is extended or adjusted under 35 U.S.C. 154(b) by 546 days.

(21) Appl. No.: 12/663,626

(22) PCT Filed: Jun. 27, 2007

(86) PCT No.: PCT/IB2007/003323
§ 371 (c)(1),
(2), (4) Date: Dec. 8, 2009

(87) PCT Pub. No.: WO2009/001162
PCT Pub. Date: Dec. 31, 2008

(65) Prior Publication Data
US 2010/0164490 A1    Jul. 1, 2010

(51) Int. Cl.
*G01R 33/05* (2006.01)
*G01R 33/02* (2006.01)
(52) U.S. Cl. .................................. 324/248; 324/252
(58) Field of Classification Search ............ 324/248, 324/252
See application file for complete search history.

(56) References Cited

U.S. PATENT DOCUMENTS
5,227,721 A    7/1993  Kataoka et al.

FOREIGN PATENT DOCUMENTS
| EP | 0 433 180 A1 | 6/1991 |
| JP | 3-185883 | 12/1989 |
| WO | WO 2004 068152 | 8/2004 |
| WO | WO 2004/068158 | 8/2004 |
| WO | WO 2007/095971 | 8/2007 |

OTHER PUBLICATIONS

Pannetier, M. et al., "Noise in small magnetic systems—applications to very sensitive magnetoresistive sensors," Journal of Magnetism and Magnetic Materials, Elsevier Science Publishers, Amsterdam, NL, vol. 290-291, Apr. 2005, pp. 1158-1160.
Pannetier-Lecoeur, M. et al., "RF Response of Superconducting-GMR Mixed Sensors, Application to NQR," IEEE Transactions on Applied Superconductivity, IEEE Service Center, Los Alamitos, CA, vol. 17, No. 2, Jun. 2007, pp. 598-601.
Pannetier, M. et al., "Femtotesla Magnetic Field Measurement With Magnetoresistive Sensors," Science, American Association for the Advancement of Science, Washington, DC, vol. 304, No. 5677, Jun. 2004, pp. 1648-1650.
Raquet, B. et al., "Electronic noise in magnetic low-dimensional materials and nanostructures," Journal of Magnetism and Magnetic Materials, Elsevier Science Publishers, Amsterdam, NL, vol. 258-259, Mar. 2003, pp. 119-124.

(Continued)

*Primary Examiner* — Reena Aurora
(74) *Attorney, Agent, or Firm* — Preti Flaherty Beliveau & Pachios LLP

(57) ABSTRACT

A device comprises a mixed sensor design with at least one superconducting loop (1) containing at least one constriction (3) and a magneto-resistive element (2) located next to the constriction (3). The device contains at least one heating element (5) that allows switching at sufficiently high frequency of at least one part of the superconducting loop (1) above its critical temperature, such that the super-current flowing through the at least one constriction (3) containing the at least one magneto-resistive element (2) is temporarily suppressed.

13 Claims, 5 Drawing Sheets

OTHER PUBLICATIONS

Jiang, L. et al., "Low-frequency magnetic and resistance noise in magnetic tunnel junctions," Physical Review, American Institute of Physics, New York, vol. 69, No. 5, Feb. 2004, pp. 054407-1-054407-9.

Magnes, W. et al., "A sigma-delta fluxgate magnetometer for space applications," Measurement Science and Technology, IOP, Bristol, GB, vol. 14, No. 7, Jul. 2003, pp. 1003-1012.

Kubik, J. et al., "Noise spectrum of pulse excited fluxgate sensor," Sensors and Actuators A, Elsevier Sequoia S.A., Lausanne, CH, vol. 132, No. 1, Nov. 2006, pp. 236-240.

Munter, P., "A Low-offset Spinning-current Hall Plate," Sensors and Actuators A, Elsevier Sequoia S.A., Lausanne, CH, vol. A22, No. 1, Mar. 1990, pp. 743-746.

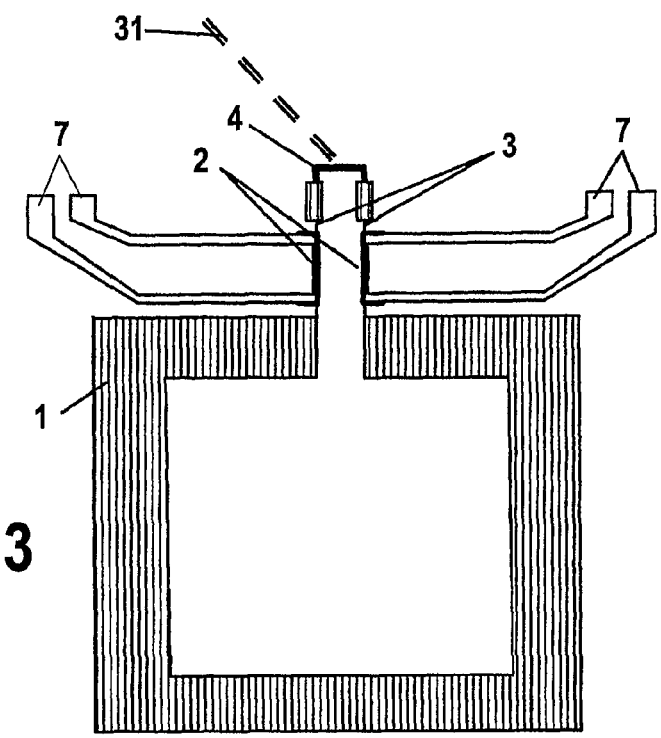
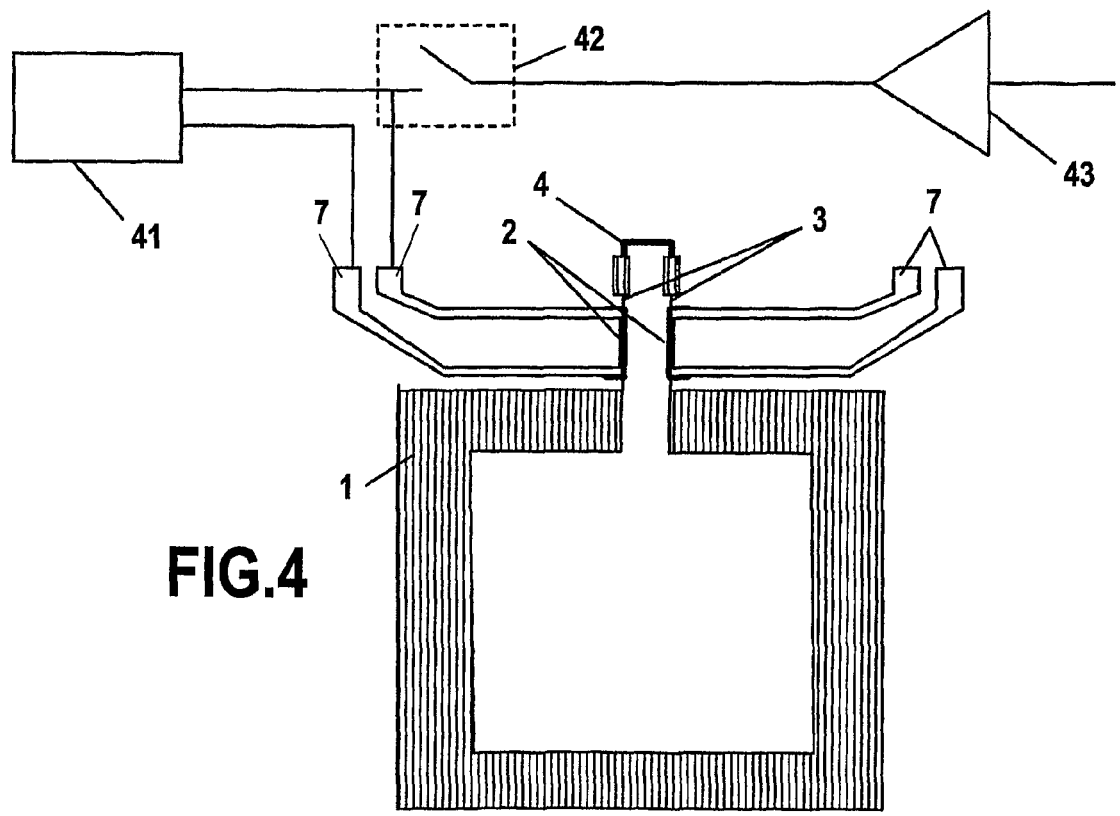

DEVICE BASED ON A MAGNETO-RESISTIVE MIXED SENSOR WITHOUT LOW FREQUENCY NOISE AND ASSOCIATED METHOD

BACKGROUND OF THE INVENTION

1. Field of the Invention

The present invention relates to a device based on a magneto-resistive mixed sensor without low frequency noise and to an associated method.

The invention more specifically relates to a mixed sensor device with a specific embodiment for low frequency cancellation of noise. Low frequency noise refers to the resistance noise of a magneto-resistive element created by low frequency fluctuations. This kind of noise appears in all physical systems and increases as the size of the system decreases. If f is the frequency of the low frequency fluctuations, the power density of the noise usually decreases as $1/f^\alpha$ where $\alpha$ is of the order of 1.

2. Description of the Related Art

The principle of mixed sensors which associates at least one superconducting loop and one magneto-resistive element for low frequency and RF applications is described in documents WO 2004/068152 A1 and WO 2004/068158 A1. The principle of the mixed sensors is also described in the publication Pannetier M, Fermon C, Le Goff G, et al. SCIENCE 304 (5677): 1648-1650 Jun. 11 2004.

Each superconducting loop contains at least one constriction. When a magnetic field is applied on the said superconducting loop, a super-current is created in the loop. The super-current flows through the constriction and locally the current density is high. The at least one magneto-resistive element is placed on top or bottom of the constriction and senses the magnetic field created by the super-current. The ratio between the applied field and the magnetic field sensed by the magneto-resistive element can be several thousands for a $cm^2$ superconducting loop and micron size constriction. The low frequency noise of a mixed sensor is due to the low frequency resistance noise of the magneto-resistive element.

Low frequency noise levels of magneto-resistive elements are extensively studied in the published literature. As for example, Giant magneto-resistance (GMR) low frequency noise is discussed in Raquet B, Viret M, Costes M, et al., JOURNAL OF MAGNETISM AND MAGNETIC MATERIALS 258: 119-124 Sp. Iss. SI March 2003. Noise in Tunnel magneto-resistive sensors (TMR) is discussed in L. Jiang et al, Phys. Rev. B 69, 2004 p 54407.

If the magnetic part of the low frequency noise can be cancelled by a proper design of the sensor (see Pannetier M, Fermon C, Le Goff G, et al. JOURNAL OF MAGNETISM AND MAGNETIC MATERIALS 290: 1158-1160 Part 2 Sp. Iss. SI April 2005), the non magnetic part has at present not be cancelled.

Document WO 2004/068152 A1 describes the use of the saturating value of the magneto-resistive element as a reference to correct temperature and ageing variations. However, this technique is not suppressing the low frequency noise of the magneto-resistive element.

Document PCT/EP2006/002599 describes the use of modulation of the sensing current for moving the working frequency of the detection outside the field detection frequency. This technique can be used to work at a frequency higher than the low frequency noise but if it suppresses the low frequency noise coming from the preamplification chain, it does not suppress the noise coming from the resistance fluctuations.

Fluxgates use a field modulation technique based on their non linear response to suppress the low frequency noise (see Magnes W, Pierce D, Valavanoglou A, Means J, Baumjohann W, Russell C T, Schwingenschuh K, Graber G, Source: MEASUREMENT SCIENCE & TECHNOLOGY 14 (7): 1003-1012 July 2003). Use of harmonics with pulsed currents has also been proposed (see Kubik J, Ripka P, SENSORS AND ACTUATORS A-PHYSICAL 132 (1): 236-240 Sp. Iss. SI, Nov. 8, 2006). These approaches cannot be applied to mixed sensors due to their linear response in the working field range.

This technique has also been tested on mixed sensors (Document WO 2004/068152 A1) but its efficiency, which is proportional to the second derivative of the resistance variation, is not sufficiently competitive due to the low non linearity of the magneto-resistive sensors.

More generally, for all types of magnetic sensors, it is known that a cancellation of the low frequency noise of a detection system can be done by a modulation of the source magnetic field at a sufficiently high frequency. Then the measurement of the source field is done around the frequency modulation and the low frequency noise of the detection system does not interfere with the measurement. A large number of publications and patents are applying that technique.

However, that technique cannot be applied when the field source cannot be modulated. This is the case of for example, the detection of magnetic fields created by the human body.

More specifically, in Hall effect based magnetic sensors, a high frequency switching of the current input and voltage output allows suppressing the low frequency noise. A description of such a method can be found in P. Munter, A low-offset spinning-current Hall plate, Sens. Actuators A: Phys. A22 (1990) (1-3), pp. 743-746. However, that technique is very specific to Hall sensors due to the vectorial nature of the Hall resistance (the measured voltage is perpendicular to the applied current direction) and cannot be applied to magneto-resistive sensors because the measured voltage is along the applied current direction.

SUMMARY OF THE INVENTION

The present invention aims at remedying the above mentioned drawbacks.

These aims are achieved due to a device comprising a mixed sensor device having at least one superconducting loop containing at least one constriction and a magneto-resistive element located next to the constriction, characterized in that it contains at least one heating element that allows switching at sufficiently high frequency of at least one part of the said superconducting loop above its critical temperature, such that the super-current flowing through said at least one constriction containing said at least one magneto-resistive element is temporarily suppressed.

According to a first embodiment the device contains a single loop and several constrictions with one heating element able to destroy circulating super-currents.

The heating element may be a conductive wire, a laser spot or the magneto-resistive element itself.

The heating element may have a large extension over a major part of the constriction.

The heating element may also be located in the neighbourhood of the constriction.

More specifically, according to an embodiment of the invention, a heating element devoted to a magneto-resistive element is embedded with it to constitute a single composite element.

According to a specific embodiment of the present invention, a device contains at least two constrictions in parallel with at least two heating elements so that the super-current can be deviated from one constriction to the other one.

With such an embodiment, the heating elements may be conductive wires, laser spots or the magneto-resistive elements themselves.

A device according to the invention may comprise heating elements having a large extension over a major part of the constrictions.

The heating elements may also be located in the neighbourhood of the constrictions.

The invention further relates to a method for suppression of low frequency noise in a magneto-resistance mixed sensor, characterized in that a local heating of parts of the mixed sensor is temporarily performed by a heating element in order to cancel the super-current sensed by at least one magneto-resistive element.

The local heating may be performed by a conductive wire or by a laser spot.

The local heating may be performed on at least one magneto-resistive element by a heating element which is embedded with said magneto-resistive element to constitute a single composite element.

The heating element may have a large extension over a major part of the constriction.

The heating element may also be located in the neighbourhood of the constriction.

According to a specific embodiment at least two constrictions with at least two heating elements are in parallel so that the super-current can be deviated from one constriction to the other one.

In such case the heating elements may be conductive wires, laser spots or else the magneto-resistive elements themselves.

Thus according to a specific embodiment, the local heating is performed on the magneto-resistive elements by heating elements which are embedded with said magneto-resistive elements to constitute composite elements.

The heating elements may advantageously have a large extension over a major part of the constrictions.

Generally speaking the heating elements may also be advantageously located in the neighbourhood of the constrictions.

An external magnetic field generated for example by the brain electrical activity which is aimed to be detected constitutes a source signal.

The device according to the invention is designed with at least one constriction where both a magneto-resistive element and a local heating device are located. The measurement of low frequency signal is achieved by switching the local heater at a frequency at least twice the maximal frequency of the measured signal such that the super-current flowing through the at least one constriction containing the at least one magneto-resistive element is temporarily suppressed.

The associated method is characterized by using local heating of parts of mixed sensors in order to temporarily cancel the super-current sensed by at least one magneto-resistive element.

In a first embodiment, the mixed sensor contains only one loop with one constriction where both the magneto-resistive element and the heating element are located. The heating of the constriction by the heating element above its critical temperature destroys any existing supercurrent in the loop hence resetting the device.

In this embodiment, one set of two measurements are performed for each point, one before the reset and one just after. The second measurement is used as the reference of the magnetoresistive element resistance.

The value corrected by low frequency fluctuations is obtained by the subtraction of the two measurements. It should be noticed that the first derivative of the source signal is obtained.

The sampling frequency (one set of measurement per sampling) is done at a frequency at least twice the maximal frequency of the detected signal. If the sampling frequency is lower, a loss of information is possible.

In another embodiment, the superconducting loop is closed by two constrictions in parallel, each containing a magnetoresistive element and a heating element. In that configuration by an alternative heating of each constriction, it is possible to toggle the super-current between one constriction to the other one. In that case, the super-current is not destroyed and the measurement gives the value of the source signal and not the first derivative.

At each toggle, there is a small loss of super-current equal to the ratio between the small loop inside the two constrictions and the superconducting loop. This induces a high pass filtering of the applied magnetic field. The sampling frequency (one set of measurement per sampling) is done at a frequency at least twice the maximal frequency of the detected signal. If the sampling frequency is lower, a loss of information is possible.

In a particular embodiment, the heating element is a conductive wire deposited on part of the constriction, and the heating is provided by current feeding in this wire.

In another embodiment, the heating element is a laser spot of few μms located on part of the constriction.

In still another embodiment, the magnetoresistive element itself can be used as a heating element.

In a specific embodiment, the heating element can have a heating action larger than the constriction width in order to block the presence of any rotating super-current in the constriction.

In another specific embodiment, the heating element is placed in the neighbourhood of the constriction but not on top to avoid perturbing fields induced by the heating in the loop.

In still another embodiment, the heating element can be a magnetic field generator, located in the vicinity of the mixed sensor, which produces field peaks perpendicular to the loop, such as a large amount of superconducting field lines (or vortices) cross the constriction, inducing, when the vortex flow is sufficient, a thermo-magnetic effect that drives the constriction above its Tc. This effect is described in Pannetier-Lecoeur M., Fermon C., PHYSICAL REVIEW B 72 (18): Art. No. 180501 November 2005

The magneto-resistive element can be alternatively an anisotropic magnetoresistance (AMR), a giant magnetoresistance (GMR), a tunnel magnetoresistance (TMR) or any other resistance exhibiting a sufficiently large variation with the magnetic field.

BRIEF DESCRIPTION OF THE DRAWINGS

Other features and advantages of the invention will appear more readily from the following description of several embodiments of the present invention, given as examples, with reference to the enclosed drawings, on which:

FIG. 3 is an example of a device according to the invention where the local heating is provided with the help of a laser spot, FIG. 4 is an example of a device according to another embodiment of the invention where the magneto-resistive element itself is used as heating element.

DETAILED DESCRIPTION OF PREFERRED EMBODIMENTS

The invention essentially addresses a mixed sensor device containing at least one heating element that allows switching at a sufficiently high frequency of at least one part of at least one superconducting loop above its critical temperature, such that the super-current flowing through the constrictions containing the magnetoresistive elements is temporarily suppressed.

The principle of the device and its preferred embodiments will be explained through the precise description of the figures.

Figure 1:
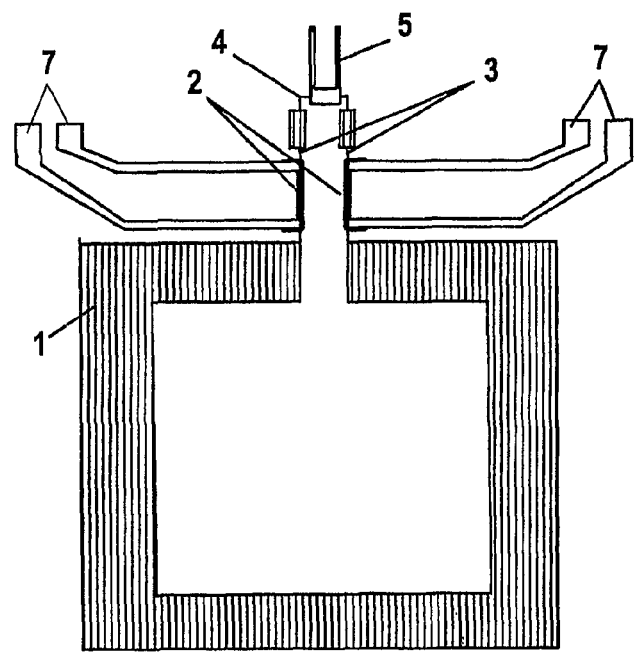
FIG. 1 is a schematic view of a device according to the present invention with a simple mixed sensor device, its local heating provided by a metallic contact line and two magneto-resistive elements.

FIG. 1 shows a simple mixed sensor with a single superconducting loop 1 which acts as a flux-to-field transformer and two magnetoresistive elements 2 placed on top of two constrictions 3 and associated with contacts 7. An additional constriction 4 is placed on the loop and is used for the local heating. The local heating is done by a metallic wire 5. A current pulse is sent to warm the constriction 4 above its critical temperature as described in FIG. 2. The two magneto-resistive elements 2 are mounted in a half bridge configuration to suppress temperature fluctuations and planar magnetic field variations.

Figure 2:
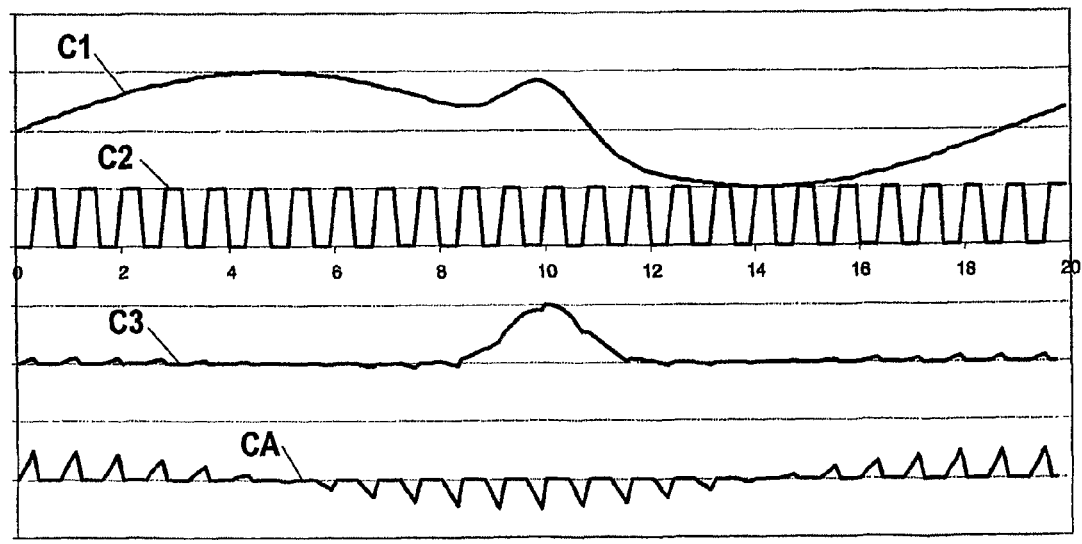
FIG. 2 shows the heating sequence used for the device given in FIG. 1 and the output signal obtained.

FIG. 2 shows the sequence used for the device given in FIG. 1. Curve C1 (top) shows the total signal detected at the output of the magneto-resistive element 2 if no heating is applied. This signal is the sum of a sine signal which models an external magnetic field component and of a noise fluctuation of the magneto-resistive element 2.

Curve C2 shows the heating sequence applied on the constriction 4.

Curve C3 shows the effective output of the magneto-resistive element 2. It can be shown that the noise fluctuation of the magneto-resistive element 2 is directly transferred but the external magnetic field signal is derived.

Curve C4 is the result of the subtraction of the signal reference obtained at each heating to the following measurement. It corresponds to the first derivative of the external magnetic field component.

FIG. 3 shows a simple mixed sensor with a single superconducting loop 1 which acts as a flux-to-field transformer and two magneto-resistive elements 2 placed on top of two constrictions 3 and associated with contacts 7. An additional constriction 4 is placed on the loop and is used for the local heating. The local heating is done by a focussed laser beam 31. A light pulse is sent to warm the constriction 4 above its critical temperature as described in FIG. 2. The two magneto-resistive elements are mounted in a half bridge configuration to suppress temperature fluctuations and planar magnetic field variations. The laser beam can be created either by a Laser or a Laser diode. The shaping and the intensity of the laser light must be fast enough to insure a rapid heating of the constriction. A pulse time of less than 10 µs is preferable for a frequency sampling above the 1/f noise frequency corner. The necessary power for the laser beam is dependant on the superconductor temperature. At 4K, a power less than 0.1 mW is sufficient to reach the critical temperature of a Niobium micron-size constriction.

FIG. 4 is an example of a device where the local heating is provided by the magneto-resistive element 2 itself. Then in addition to the standard resistance measurement 41 a fast switch 42 is added to connect temporarily a strong current source 43 which injects a large current in the magneto-resistive element 2.

Figure 5:
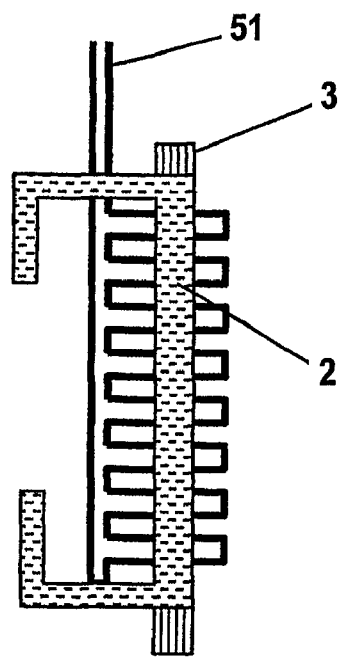
FIG. 5 is an example of a device according to the invention where the magneto-resistive element is a conductive wire with a large extent.

FIG. 5 shows a detail of a device where the heating element is a conductive wire 51 which covers the entire surface of the constriction 3. In that case, any remaining super-current in the constriction is destroyed. This configuration would be preferred in case of large constriction where rotating super-current can appear if a single point is heated and perturb the measurement by the magneto-resistive element.

Figure 6:
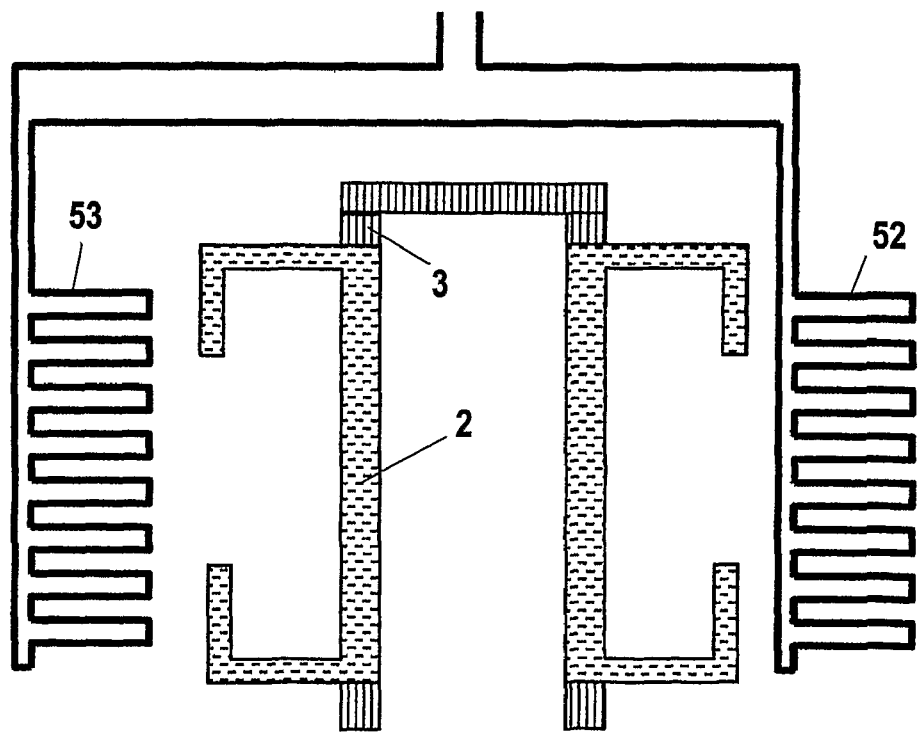
FIG. 6 is an example of a device according to the invention where the heating element is located next to the constriction but not on top or below to avoid current effects in the loop whilst being located in the neighbourhood of the constriction.

FIG. 6 shows a detail of a device where the heating elements 52, 53 are not placed on top or bottom of the constrictions 3 but are located in the neighbourhood of the constrictions 3 in order to avoid fields induced by the heating current in the superconducting loop.

Figure 7:
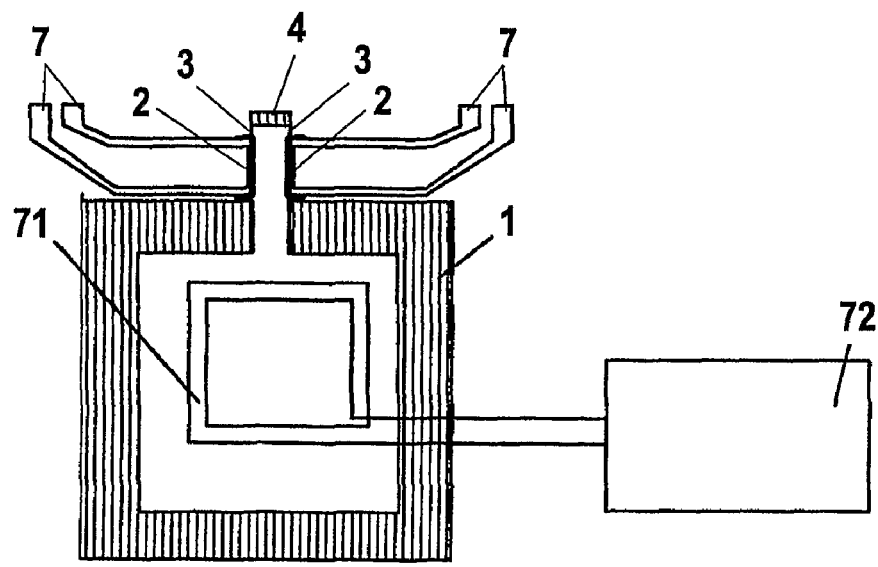
FIG. 7 is an example of a device according to the invention where the local heating is provided with the help of an external magnetic field.

FIG. 7 is an example of a device where the local heating is provided with the help of an external magnetic field. The magnetic field is applied through a coil 71. The applied magnetic field should be a pulse with an intensity which is high enough to reach the critical current of the constriction 3 and is generated by a pulsed source 72. A field of 1 mT is usually high enough, but for a mixed sensor with a gain of 1000, a field of 1 µT is sufficient. The time slope of the field variation should be higher than 5 Tesla per second to insure a proper heating of the constriction.

That technique works well on Niobium mixed sensors. For high-Tc superconductor (such as the YBaCuO compound) operated at low temperature, therefore far from their $T_c$, the total amount of vortices necessary to achieve a local heating of the constriction may be too high depending of the material quality.

Figure 8:
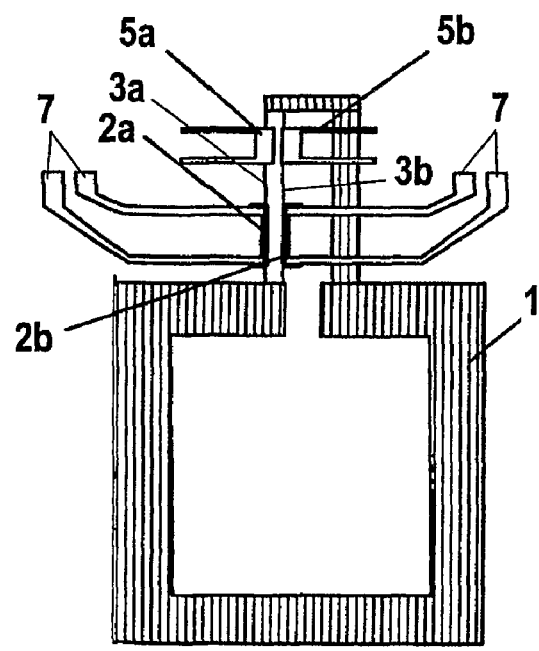
FIG. 8 is an example of a device according to the invention where a parallel set of constrictions is used.

As shown in FIG. 8, the device can also comprise two constrictions 3a, 3b in parallel, each of the constrictions containing a magneto resistive (MR) element and a heating element 5a, 5b. The heating element 5a of the first branch is activated first, while the output signal of the MR element 2b of the other branch is measured. On the next step of the sequence, the heating element 5b of the second branch is activated, while the measurement of the first branch MR element 2a is acquired, and so on. The heating acts as a switch of a supercurrent. The main interest is to keep the value of the super-current and so the memory of the external field contrary to the technique described before where the reset of the super-current cancels the field history. At each toggle, there is a loss of supercurrent equal to the ratio of the total surface and the surface included in the two branches. For that reason, there is an additional effect of high pass filtering of the external field.

If the measuring frequency band is 10 Hz to 1 KHz, then the toggle frequency should be higher than 2 kHz. If the ratio of the surfaces is 1000 then the loss for each toggle is 0.1% of the supercurrent. A loss of 1/e is obtained after 367 toggles corresponding to 182 ms for 2 kHz. This is the same behaviour than a high pass filter of second order with a cut-off frequency of 6 Hz.

Figure 9:
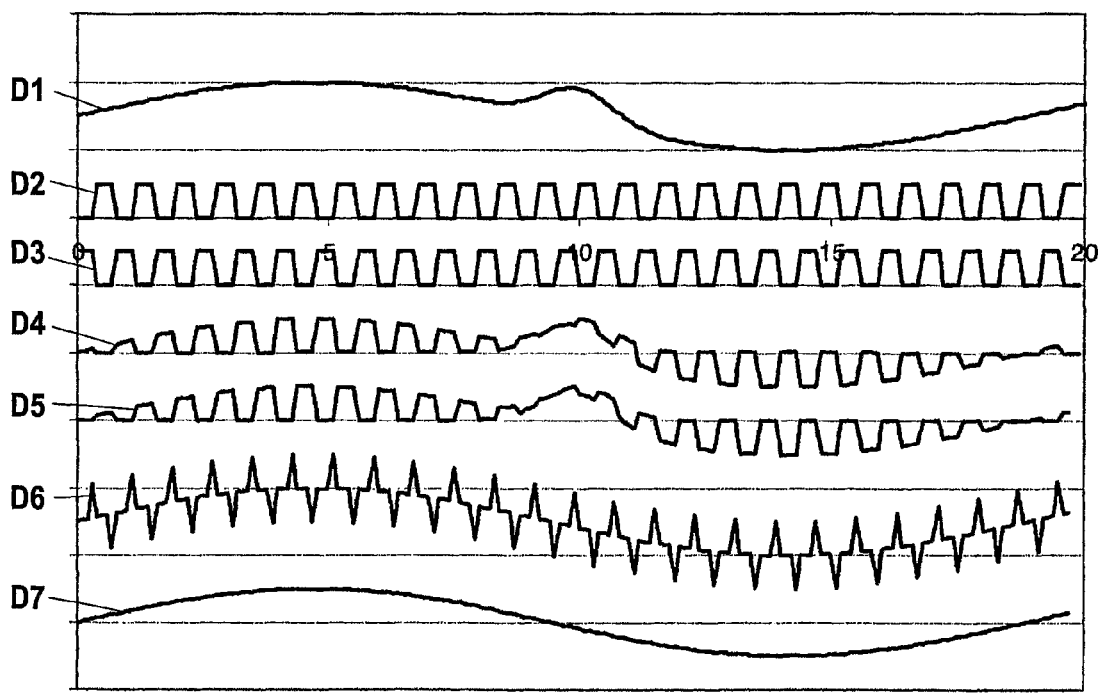
FIG. 9 shows the heating sequence used for the device given in FIG. 8 and the output signal obtained.

FIG. 9 shows the sequence used for the device given in FIG. 5. Curve D1 (top) shows the total signal detected at the output of the magneto-resistive elements 2a, 2b if no heating is applied. This signal is the sum of a sinus signal which models an external magnetic field component and of a noise fluctuation of the magneto-resistive element 2a, 2b. Curve D2 shows the heating sequence applied on the first heating element 5a. Curve D3 shows the heating sequence applied on the second heating element 5b. It should be noticed that the sequence has to be adjusted so that the two heating elements 5a, 5b are not heated at the same time to avoid the loss of super-current except if a reset is done. Curve D4 shows the effective output of the first magnetoresistive element 2a. Curve D5 shows the effective output of the second magnetoresistive element 2b. Curve D6 is the result obtained by subtraction of output measured with and without super-current on each magneto-resistive element 2a, 2b. Curve D7 is the reconstructed signal after anti-aliasing filtering. An anti-aliasing filter is a high order low pass filter which takes out frequency components at the sampling frequency, here the frequency of the toggle.

The invention claimed is:

1. A device comprising a magneto-resistive mixed sensor with at least one superconducting loop containing at least first and second constrictions arranged in parallel and first and second magneto-resistive elements respectively located next to said first and second constrictions, characterized by at least first and second heating elements respectively associated with said first and second constrictions that allow switching at sufficiently high frequency of each of said first and second constrictions of said superconducting loop above its critical temperature, such that a super-current flowing through one of said first and second constrictions located next to a respective one of said first and second magneto-resistive elements is temporarily suppressed, so that a super-current of the magneto-resistive mixed sensor is deviated from one of said first and second constrictions to the other of said first and second constrictions at a frequency at least twice a maximal frequency of a measured signal.

2. A device according to claim 1, characterized in that the first and second heating elements are conductive wires.

3. A device according to claim 1, characterized in that the first and second heating elements are laser spots.

4. A device according to claim 1, characterized in that the first and second heating elements devoted to the respective first and second magneto-resistive elements are embedded with them to constitute single composite elements.

5. A device according to claim 1, characterized in that the first and second heating elements have a large extension over a major part of the corresponding first and second constrictions respectively.

6. A device according to claim 1, characterized in that the first and second heating elements are located in the neighborhood of the corresponding first and second constrictions respectively.

7. A method of suppression of low frequency noise in a magneto-resistive mixed sensor with at least one superconducting loop containing at least first and second constrictions arranged in parallel and first and second magneto-resistive elements respectively located next to said first and second constrictions, and at least first and second heating elements respectively associated with said first and second constrictions, wherein the method comprises a step of locally temporarily heating said first and second constrictions of the magneto-resistive mixed sensor to alternately heat them above a magneto-resistive critical temperature in order to cancel a super-current sensed by one of said first and second magneto-resistive elements associated with a respective one of said first and second constrictions, so that a super-current of the magneto-resistive mixed sensor is deviated from one of said first and second constrictions to the other of said first and second constrictions at a frequency at least twice a maximal frequency of a measured signal.

8. A method according to claim 7, characterized in that the first and second heating elements are conductive wires.

9. A method according to claim 7, characterized in that the first and second heating elements are laser spots.

10. A method according to claim 7, characterized in that the local heating is performed on the first and second magneto-resistive elements by said first and second heating elements which are embedded with said first and second magneto-resistive elements to constitute composite elements.

11. A method according to claim 7, characterized in that the first and second heating elements have a large extension over a major part of the corresponding first and second constrictions respectively.

12. A method according to claim 7, characterized in that the first and second heating elements are located in the neighborhood of the corresponding first and second constrictions respectively.

13. A method according to claim 7, characterized in that:
the first and second heating elements have a large extension over a major part of the corresponding first and second constriction respectively; and
the first and second heating elements are located in the neighborhood of the corresponding first and second constrictions respectively.

* * * * *